(12) United States Patent
Chen

(10) Patent No.: US 9,910,114 B2
(45) Date of Patent: Mar. 6, 2018

(54) COOLING DEVICE AND METHOD FOR MAGNETIC RESONANCE IMAGING SYSTEM

(71) Applicant: Ping Chen, Shenzhen (CN)

(72) Inventor: Ping Chen, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 452 days.

(21) Appl. No.: 14/553,450

(22) Filed: Nov. 25, 2014

(65) Prior Publication Data

US 2015/0153428 A1    Jun. 4, 2015

(30) Foreign Application Priority Data

Nov. 29, 2013  (CN) .......................... 2013 1 0628684

(51) Int. Cl.

| G01V 3/00 | (2006.01) |
| G01R 33/38 | (2006.01) |
| G01R 33/385 | (2006.01) |
| F25B 25/00 | (2006.01) |
| F25B 49/02 | (2006.01) |
| G01R 33/34 | (2006.01) |

(52) U.S. Cl.
CPC ........ *G01R 33/3804* (2013.01); *F25B 25/005* (2013.01); *F25B 49/022* (2013.01); *G01R 33/3856* (2013.01); *F25B 2339/047* (2013.01); *F25B 2600/0253* (2013.01); *F25B 2600/13* (2013.01); *G01R 33/3403* (2013.01); *Y02B 30/741* (2013.01); *Y02B 30/745* (2013.01)

(58) Field of Classification Search
CPC .................................................. G01R 33/3804
USPC ........................................ 324/315, 318, 322
See application file for complete search history.

(56) References Cited

U.S. PATENT DOCUMENTS

| 6,909,283 B2 * | 6/2005 | Emeric | G01R 33/3856 324/300 |
| 6,977,501 B2 * | 12/2005 | Kassai | G01R 33/3856 324/315 |
| 7,593,291 B2 | 9/2009 | Ito | |
| 7,868,617 B2 * | 1/2011 | Seeber | G01R 33/3804 324/318 |
| 8,188,741 B2 * | 5/2012 | Sakakura | G01R 33/3856 324/318 |
| 8,305,079 B2 * | 11/2012 | Iwasa | G01R 33/3804 324/315 |

FOREIGN PATENT DOCUMENTS

WO    WO2009150576 A1    12/2009

* cited by examiner

*Primary Examiner* — Louis Arana
(74) *Attorney, Agent, or Firm* — Lempia Summerfield Katz LLC

(57) ABSTRACT

A cooling device is provided for an MRI system. A regulation unit for driving a refrigerant to subject the MRI system to a refrigeration cycle is based on a pre-collected cooling power demand of the MRI system in at least one state. By way of the cooling device and cooling method, the amount of energy needed to cool the MRI device is reduced.

13 Claims, 2 Drawing Sheets

COOLING DEVICE AND METHOD FOR MAGNETIC RESONANCE IMAGING SYSTEM

RELATED CASE

This application claims the benefit of CN 201310628684.5, filed on Nov. 29, 2013, which is hereby incorporated by reference in its entirety.

TECHNICAL FIELD

The present embodiments relate to the field of magnetic resonance imaging devices, in particular to a cooling device and method for a magnetic resonance imaging system.

BACKGROUND

Magnetic resonance imaging (MRI) systems have a broad range of uses in the medical field. An MRI system contains many system components that generate heat at high power, such as the cold head compressor, gradient coils (GC), gradient power amplifier (GPA), and radio frequency power amplifier (RFPA). A cooling system is generally needed to cool these system components that generate heat at high power.

FIG. 1 is an existing cooling device for an MRI device. As FIG. 1 shows, a first pump 4 supplies cooling water at a low temperature to a pipeline for cooling an MRI device M, to absorb heat generated during operation of the MRI device. After heating up, the cooling water is sent into an evaporator 8 and undergoes heat exchange with a refrigerant in the evaporator, experiences a drop in temperature, and is sent to the first pump 4 again. Having turned into vapor due to a temperature increase caused by the heat exchange in the evaporator 8, the refrigerant is compressed to form a vapor at high temperature and high pressure in the compressor 5, and discharged into a condenser 10. In the condenser 10, the vapor releases heat to a cooling medium, condensing to form a high-pressure liquid, before passing through an expansion valve 9 to become a refrigerant at low pressure and low temperature. In the condenser 10, water that has heated up through heat exchange with the refrigerant is sent to a pump 6, and undergoes a cooling treatment by a fan 7 before being sent back to the condenser 10. However, in such a cooling device, it is generally necessary to operate the compressor, pump and fan continuously, so the amount of energy consumed is quite large. Moreover, in the case of certain MRI systems that switch back and forth between high-load operation and low-load operation, the water supply temperature in the cooling device will experience large fluctuations, with the result that the stability of the water-cooled MRI systems is affected.

SUMMARY

The scope of the present invention is defined solely by the appended claims and is not affected to any degree by the statements within this summary.

According to one aspect, a cooling device for an MRI system is proposed. A refrigerant and a regulation unit are provided. The refrigerant is for subjecting the MRI system to refrigeration, and the regulation unit is for driving the refrigerant based on a pre-collected cooling power demand corresponding to a state of the MRI system.

According to another aspect, a cooling method for an MRI system is proposed. Based on a pre-collected cooling power demand corresponding to a state of the MRI system, a refrigerant is driven to subject the MRI system to refrigeration.

An MRI system in one embodiment includes a control unit and the cooling device. The control unit is for sending a state of the MRI system to the regulation unit.

By way of the cooling device and cooling method for the MRI system, a reduction in energy consumption is combined with control of cooling liquid temperature fluctuation, and the MRI system is cooled with greater precision by a closed-loop control method.

DESCRIPTION OF THE ACCOMPANYING DRAWINGS

To give those skilled in the art a clearer understanding of the above and other features and merits of the present invention, preferred embodiments thereof will be described in detail below with reference to the accompanying drawings, in which.

DETAILED DESCRIPTION OF THE PREFERRED EMBODIMENTS

Figure 1:
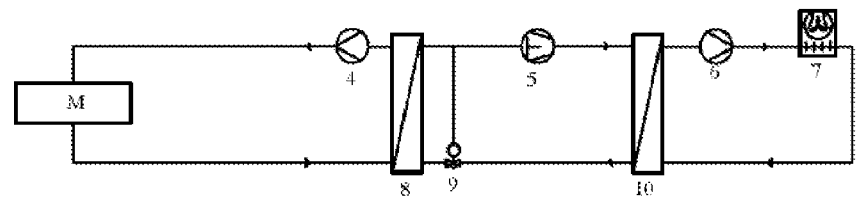
FIG. 1 is a schematic diagram of an existing cooling device for an MRI system.
Figure 2:
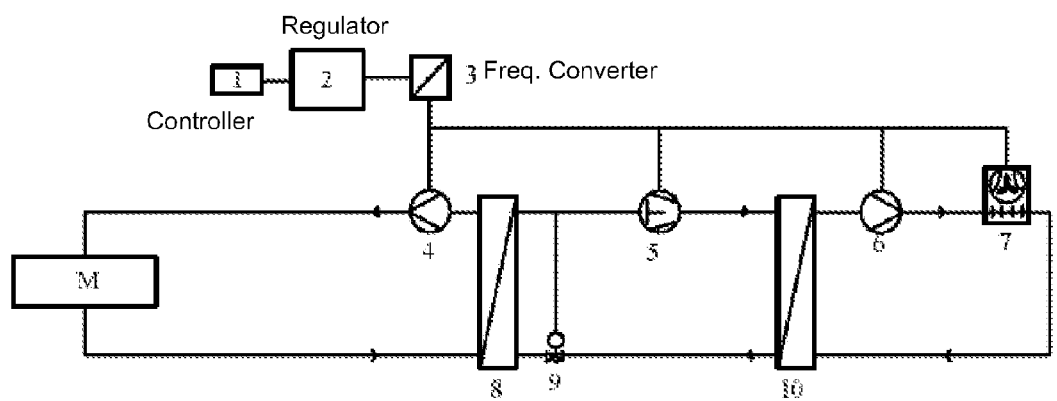
FIG. 2 is a schematic diagram of a cooling device for an MRI system according to an embodiment.

FIG. 2 is a schematic diagram of a cooling device for an MRI system M according to an embodiment. The cooling device includes a mainframe or computer 1 serving as a control unit, a regulation unit 2, a frequency converter 3, a first pump 4, a compressor 5, a second pump 6, a fan 7, an evaporator 8, an expansion valve 9 and a condenser 10. The computer 1 is for sending a scan sequence for performing a sequence scan operation to the MRI system M, and sending a pre-collected cooling power demand corresponding to this scan sequence to the regulation unit 2. The regulation unit 2 is for determining, based on a cooling power demand calculation, a step frequency required by at least one motive power component, converting the step frequency into a regulation signal, and sending the regulation signal to the frequency converter 3. The frequency converter 3 is for regulating a step frequency of a motive power component according to the regulation signal in order to regulate a rotation speed of at least one motive power component. The at least one motive power component is for running at a regulated rotation speed, to drive a refrigerant to perform a refrigeration cycle.

Specifically, multiple scan sequences for making the MRI device M perform different scan operations, as well as corresponding pre-measured cooling power demands, are stored on the computer 1. By "scan sequence", it is meant settings for relevant parameters such as the RF pulse, gradient field and signal acquisition time, as well as the sequence thereof in time. MR imaging is principally dependent on four factors: proton density, relaxation times T1 and T2, and the flow void effect. By using different magnetic resonance scan sequences, it is possible to obtain images that reflect different weightings of these factors.

An explanation shall now be given, using a scan sequence A as an example, of how a corresponding cooling power demand is measured in advance. For instance, the scan sequence A is run, and the MRI device M performs a scan according to the relevant parameters defined by the scan sequence A, while at the same time, a measuring tool (including for example a flow sensor, a temperature sensor, etc.) is used to measure the overall cooling liquid flow rate of the MRI device M, as well as the temperature difference between incoming and outgoing cooling liquid. On this basis, it is possible to calculate a cooling power demand (or real-time cooling power demand) for each point in time in the timeframe during which the MRI device M is running the scan sequence A. The power demand may be expressed in the form of a "cooling power-scan time" graph.

When the MRI device and the cooling device are operating, a user, for instance a doctor, selects a scan sequence on the computer 1. The computer 1 sends the scan sequence to the MRI device M, and sends a corresponding cooling power demand to the regulation unit 2. The regulation unit 2 may be realized as a single-chip microcomputer, a printed circuit board or a printed circuit board assembly (PCBA). The computer 1 and regulation unit 2 may communicate with each other in a wired or a wireless manner. On the basis of a calculation based on the cooling power demand, the regulation unit 2 determines a specific step frequency required by a motive power component of the cooling device, and sends a regulation signal corresponding to the step frequency to the frequency converter 3.

As stated above, the real-time cooling power demand during running of the scan sequence A by the MRI system M has been measured in advance. Therefore the regulation unit 2 may calculate the percentage of "real-time cooling power demand/maximum refrigeration power" for each point in time, according to the specific value of the real-time cooling power demand and the value of the maximum cooling power of the device. Based on this percentage and the power supply frequency under the current operating conditions, the regulation unit 2 may calculate a step frequency output matching the real-time cooling power demand. This frequency output result may be expressed in the form of a "step frequency-scan time" graph, for example. In the cooling device of this embodiment, the motive power components may have the same step frequencies; alternatively, different step frequencies may be determined according to parameters of different motive power components.

Next, the frequency converter 3 supplies electrical power of a specific step frequency to a motive power component according to the regulation signal, to regulate the rotation speed of the motive power component. In this example, the motive power components are for example the first pump 4, compressor 5, second pump 6 and fan 7. These motive power components then run at the regulated rotation speed, driving a refrigerant to perform the refrigeration cycle. The refrigerant is for example water, air, Freon, etc.

As FIG. 2 shows, the refrigeration cycle includes a cooling liquid loop, which acts on the MRI device M and includes the first pump 4, evaporator 8 and a cooling liquid pipeline. In the cooling liquid loop, the first pump 4 supplies low-temperature cooling liquid to the pipeline for cooling the MRI device M, in order to absorb the heat given off during operation of the MRI device. After heating up, the cooling liquid is sent into the evaporator 8 and undergoes heat exchange with refrigerant in the evaporator, experiences a drop in temperature, and is sent to the first pump 4 again. The refrigerant is, for example, Freon. The cooling liquid may be water or another liquid.

Having turned into vapor due to a temperature increase caused by the heat exchange in the evaporator 8, the refrigerant is compressed to form a vapor at high temperature and high pressure in the compressor 5, and discharged into the condenser 10. In the condenser 10, the vapor releases heat to a cooling medium (e.g., water in this embodiment), condensing to form a high-pressure liquid, before passing through an expansion valve 9 to become refrigerant at low pressure and low temperature, to perform the next cycle. In the condenser 10, water that has heated up through heat exchange with the refrigerant is sent to a pump 6, and undergoes a cooling treatment by a fan 7 before being sent back to the condenser 10, to perform the next cycle.

Such a cooling device achieves power regulation on its own initiative under different operating conditions of the MRI system, reducing energy consumption.

Furthermore, a cooling power demand of the MRI system M in a standby state or shutdown state is also stored in the computer 1. When the MRI system M is in the standby state or shutdown state, the computer 1 will send the corresponding cooling power demand to the regulation unit 2; the subsequent operations are as described above.

In a specific example, suppose that when the maximum cooling demand of the MRI system M is 100%, the power supply voltage is 400 V, with a frequency of 50 Hz. When the user selects a scan sequence with a cooling power demand of 50% for the MRI system M, the frequency converter 3 correspondingly outputs a frequency of 25 Hz for motive power components, namely the compressor 5, first pump 4, second pump 6 and fan 7. The motive power components then run at 50% rotation speed.

Figure 3:
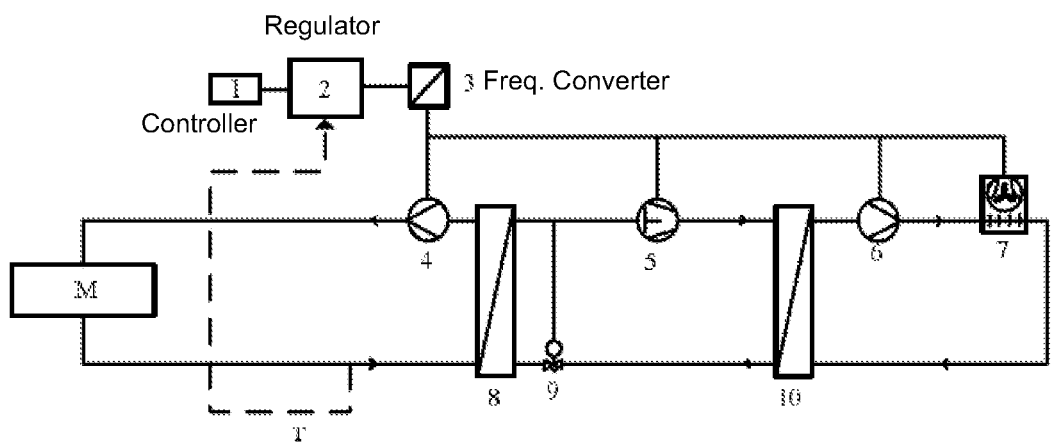
FIG. 3 is a schematic diagram of a cooling device for an MRI system according to another embodiment.

FIG. 3 is a schematic diagram of a cooling device for an MRI device according to another embodiment. In this embodiment, the temperature T of cooling liquid that has cooled the MRI device (i.e. the temperature of cooling liquid sent to the evaporator 8 after cooling the MRI system M) is further measured, in order to finely regulate the signal sent to the frequency converter by the regulation unit. Specifically, if, for example, a temperature threshold is set, then when the cooling liquid temperature T detected is higher than the threshold, the rotation speed of the motive power component is increased within a certain range. In the opposite case, the rotation speed of the motive power component is reduced within a certain range. Various types of temperature sensors may be used to measure the cooling liquid temperature, such as, for example, a negative temperature coefficient (NTC) temperature sensor.

Through the acquisition of the cooling liquid temperature, in addition to saving energy, fine regulation of the motive power component is performed via the regulation unit 2 and frequency converter 3 by closed-loop control. Fluctuation of the cooling liquid temperature is controlled, and the MRI system is cooled with greater precision.

Figure 4:
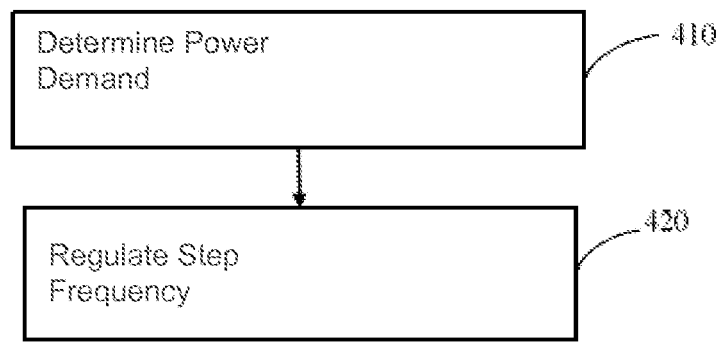
FIG. 4 is a flow chart of a cooling method for an MRI system according to an embodiment.

FIG. 4 is a flow chart of a cooling method for an MRI device according to an embodiment. As FIG. 4 shows, in act 410, when the computer 1 serving as control unit sends a scan sequence selected by a user to the MRI system M, and the MRI system performs a sequence scan operation according to the scan sequence, the computer 1 at the same time sends a pre-measured and collected cooling power demand corresponding to the scan sequence to the regulation unit 2. On the basis of a calculation based on the cooling power demand, the regulation unit 2 determines a specific step frequency required by a motive power component of the cooling device, and converts this step frequency into a regulation signal to be sent to the frequency converter 3. In act 420, the frequency converter 3 regulates a step frequency of the motive power component of the cooling device according to the regulation signal, controlling the motive power component to run at a rotation speed corresponding to the step frequency, to drive the refrigerant to perform the refrigeration cycle.

By "scan sequence", it is meant settings for relevant parameters such as the RF pulse, gradient field and signal acquisition time, as well as the sequence thereof in time. MR imaging is principally dependent on four factors: proton density, relaxation times T1 and T2, and the flow void effect. By using different magnetic resonance scan sequences, it is possible to obtain images which reflect different weightings of these factors.

An explanation is now given, using a scan sequence A as an example, of how a corresponding cooling power demand is measured in advance. For instance, the scan sequence A is run, and the MRI device M performs a scan according to the relevant parameters defined by the scan sequence A. While at the same time, a measuring tool (including for example a flow sensor, a temperature sensor, etc.) is used to measure the overall cooling liquid flow rate of the MRI device M, as well as the temperature difference between incoming and outgoing cooling liquid. On this basis, it is possible to calculate a cooling power demand (or real-time cooling power demand) for each point in time in the timeframe during which the MRI device M is running the scan sequence A. The power demand can be expressed in the form of a "cooling power-scan time" graph.

Specifically, in act 410 shown in FIG. 4, a user, for instance a doctor, selects a scan sequence on the computer 1. The computer 1 sends the scan sequence to the MRI system M, and sends a corresponding cooling power demand to the regulation unit 2. On the basis of a calculation based on the cooling power demand, the regulation unit 2 determines a specific step frequency for a motive power component of the cooling device, and sends a regulation signal corresponding to the step frequency to the frequency converter 3.

As stated above, the real-time cooling power demand during running of the scan sequence A by the MRI system M has been measured in advance. Therefore the regulation unit 2 may calculate the percentage of "real-time cooling power demand/maximum refrigeration power" for each point in time, according to the specific value of the real-time cooling power demand and the value of the maximum cooling power of the device. Based on this percentage and the power supply frequency under the current operating conditions, the regulation unit 2 may calculate a step frequency output matching the real-time cooling power demand. This frequency output result may be expressed in the form of a "step frequency-scan time" graph, for example.

In the method of this embodiment, the motive power components may have the same step frequencies; alternatively, different step frequencies may be determined according to parameters of different motive power components.

In the method of this embodiment, the regulation unit 2 may be realized as a single-chip microcomputer, a printed circuit board or a printed circuit board assembly (PCBA). The computer 1 and regulation unit 2 may communicate with each other in a wired or a wireless manner.

Next, in act 420, the frequency converter 3 supplies electrical power of a specific step frequency to a motive power component according to the regulation signal, to regulate the rotation speed of the motive power component. In this example, the motive power components are for example the first pump 4, compressor 5, second pump 6 and fan 7. These motive power components then run at the regulated rotation speed, driving a refrigerant to perform the refrigeration cycle. The refrigerant is for example water, air, Freon, etc.

In the cooling method described above, a cooling liquid loop including the first pump 4, evaporator 8 and cooling liquid pipeline is used in the refrigeration cycle, to act on the MRI device, and cool the MRI device. In the cooling liquid loop, the first pump 4 supplies low-temperature cooling liquid to the pipeline for cooling the MRI device M, to absorb the heat given off during operation of the MRI device. After heating up, the cooling liquid is sent into the evaporator 8 and undergoes heat exchange with refrigerant in the evaporator, experiences a drop in temperature, and is sent to the first pump 4 again. The refrigerant is, for example, Freon. The cooling liquid may be water or another liquid.

Having turned into vapor due to a temperature increase caused by the heat exchange in the evaporator 8, the refrigerant is compressed to form a vapor at high temperature and high pressure in the compressor 5, and discharged into the condenser 10. The refrigerant is, for example, Freon. In the condenser 10, the vapor releases heat to a cooling medium (e.g., water), condensing to form a high-pressure liquid, before passing through an expansion valve 9 to become refrigerant at low pressure and low temperature, to perform the next cycle. In the condenser 10, water that has heated up through heat exchange with refrigerant is sent to a pump 6, and undergoes a cooling treatment by a fan 7 before being sent back to the condenser 10, to perform the next cycle.

Further, in act 420, the mainframe 1 sends a pre-collected cooling power demand corresponding to a standby state or shutdown state to the regulation unit 2, when the MRI device M is in the standby state or shutdown state. On the basis of a calculation based on the cooling power demand, the regulation unit 2 determines a step frequency for making a motive power component of the cooling device run, and converts this step frequency into a regulation signal to be sent to the frequency converter 3. The frequency converter 3 controls the motive power component to run at a rotation speed corresponding to the step frequency according to the regulation signal, to drive refrigerant to perform the refrigeration cycle.

In addition, in act 420, the temperature T of cooling liquid that has cooled the MRI device (i.e. the temperature of cooling liquid sent to the evaporator 8 after cooling the MRI device M) is further measured, in order to finely regulate the signal sent to the frequency converter by the regulation unit. Specifically, if for example a temperature threshold is set, then when the detected cooling liquid temperature is higher than the threshold, the rotation speed of the motive power component is increased within a certain range. In the opposite case, the rotation speed of the motive power component is reduced within a certain range. Various types of temperature sensors may be used to measure the cooling liquid temperature, for example a negative temperature coefficient (NTC) temperature sensor.

Through the adoption of the method of this embodiment, in addition to saving energy, fine regulation of the motive power component is performed via the regulation unit 2 and frequency converter 3 by a closed-loop control method, so that fluctuation of the cooling liquid temperature is controlled, and the MRI system is cooled with greater precision.

The above embodiments are merely preferred embodiments of the present invention, and are not intended to limit it. Any amendments, equivalent substitutions or improvements etc. made within the spirit and principles of the present invention should be included in the scope of protection thereof.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A cooling device for a magnetic resonance imaging (MRI) system, the cooling device comprising:
   a refrigerant for subjecting the MRI system to refrigeration;
   at least one motive power component for driving the refrigerant to perform a refrigeration cycle based on a step frequency signal; and
   a regulation unit for driving the refrigerant based on a pre-collected cooling power demand corresponding to a state of the MRI system, wherein the regulation unit is configured to determine the step frequency signal for the at least one motive power component based on the cooling power demand.

2. The cooling device as claimed in claim 1, further comprising a frequency converter for regulating a rotation speed of the at least one motive power component based on the step frequency signal to drive the refrigerant to perform the refrigeration.

3. The cooling device as claimed in claim 1, wherein the refrigeration cycle comprises a cooling liquid loop acting on the MRI system.

4. The cooling device as claimed in claim 3, wherein the regulation unit is also configured for acquiring in real-time a cooling liquid temperature returned by the cooling liquid loop and further regulating the step frequency signal according to the cooling liquid temperature.

5. The cooling device as claimed in claim 1, wherein the state comprises a sequence scan state, a standby state or a shutdown state.

6. An MRI system comprising:
   a control unit configured to send a state of the MRI system to a regulation unit;
   a refrigerant for subjecting the MRI system to refrigeration;
   at least one motive power component for driving the refrigerant to perform the refrigeration cycle based on a step frequency signal; and
   the regulation unit for driving the refrigerant based on a pre-collected cooling power demand corresponding to the state of the MRI system, the regulation unit configured to determine the step frequency signal for the at least one motive power component based on the cooling power demand.

7. The MRI system as claimed in claim 6, further comprising a frequency converter for regulating a rotation speed of the at least one motive power component based on the step frequency signal to drive the refrigerant to perform the refrigeration.

8. The MRI system as claimed in claim 6, wherein the refrigeration cycle comprises a cooling liquid loop acting on the MRI system.

9. The MRI system as claimed in claim 8, wherein the regulation unit is also configured for acquiring in real-time a cooling liquid temperature returned by the cooling liquid loop and further regulating the step frequency signal according to the cooling liquid temperature.

10. A cooling method for an MRI system, the method comprising:
    determining a state of the MRI system; and
    based on a pre-collected cooling power demand corresponding to the state of the MRI system, driving a refrigerant to subject the MRI system to refrigeration
    based on the cooling power demand, determining a step frequency signal for making at least one motive power component of a cooling device run, the motive power component driving the refrigerant to perform the refrigeration based on the step frequency signal.

11. The cooling method as claimed in claim 10, wherein the refrigeration comprises using a cooling liquid loop to act on the MRI system.

12. The cooling method as claimed in claim 11, the method further comprising: acquiring in real time a cooling liquid temperature returned by the cooling liquid loop, and further regulating the step frequency signal according to the cooling liquid temperature.

13. The cooling method as claimed in claim 10, wherein the state comprises a sequence scan state, a standby state or a shutdown state.

* * * * *